United States Patent
Hsu et al.

[11] Patent Number: 5,480,828
[45] Date of Patent: Jan. 2, 1996

[54] DIFFERENTIAL GATE OXIDE PROCESS BY DEPRESSING OR ENHANCING OXIDATION RATE FOR MIXED 3/5 V CMOS PROCESS

[75] Inventors: Shun-Liang Hsu, Hsin-Chu; Jyh-Min Tsaur, Miao-Lini; Mou S. Lin; Jyh-Kang Ting, both of Hsin-Chu, all of Taiwan

[73] Assignee: Taiwan Semiconductor Manufacturing Corp. Ltd., Hsin-Chu, Taiwan

[21] Appl. No.: 316,084

[22] Filed: Sep. 30, 1994

[51] Int. Cl.⁶ .............................. H01L 21/8234
[52] U.S. Cl. .............. 437/56; 437/24; 437/979; 148/DIG. 116
[58] Field of Search ................ 437/24, 56, 57, 437/979, 985; 148/DIG. 116, DIG. 163

[56] References Cited

U.S. PATENT DOCUMENTS

| | | | |
|---|---|---|---|
| 4,651,406 | 3/1987 | Shimizu et al. | 437/43 |
| 4,716,126 | 12/1987 | Cogan | 437/24 |
| 4,748,134 | 5/1988 | Holland et al. | 437/24 |
| 4,948,742 | 8/1990 | Nishimura et al. | 437/24 |
| 5,330,920 | 7/1994 | Soleimani et al. | 437/24 |

FOREIGN PATENT DOCUMENTS 4-33375  2/1992  Japan .
5-275640 10/1993 Japan .

Primary Examiner—Chandra Chaudhari
Attorney, Agent, or Firm—George O. Saile; Rosemary L. S. Pike

[57] ABSTRACT

A new method of simultaneously forming differential gate oxide for both 3 and 5 V transistors is described. A sacrificial silicon oxide layer is formed on the surface of a semiconductor substrate. Ions are implanted through the sacrificial silicon oxide layer into the planned 3 V transistor area of the semiconductor substrate wherein the implanted ions depress the oxidation rate of the semiconductor substrate. Alternatively, ions are implanted through the sacrificial silicon oxide layer into the planned 5 V transistor area of the semiconductor substrate wherein the implanted ions increase the oxidation rate of the semiconductor substrate. The sacrificial silicon oxide layer is removed and a layer of gate silicon oxide is grown on the surface of the semiconductor substrate. The growth rate of the gate silicon oxide will be slowed in the planned 3 V transistor area or will be increased in the planned 5 V transistor area resulting in a gate silicon oxide layer which is relatively thinner in the planned 3 V transistor area and relatively thicker in the planned 5 V transistor area. A layer of polysilicon is deposited over the gate silicon oxide layer and patterned to form gate electrodes for the 3V and 5V transistors.

16 Claims, 4 Drawing Sheets

5,480,828

DIFFERENTIAL GATE OXIDE PROCESS BY DEPRESSING OR ENHANCING OXIDATION RATE FOR MIXED 3/5 V CMOS PROCESS

BACKGROUND OF THE INVENTION (1) Field of the Invention

The invention relates to a method of fabricating both 3 and 5 volt CMOS transistors in the fabrication of integrated circuits, and more particularly, to a method of fabricating both 3 and 5 volt CMOS transistors simultaneously by depressing or enhancing gate silicon oxide growth in the fabrication of integrated circuits.

(2) Description of the Prior Art

The gate oxide thickness is the major issue in terms of reliability considerations in mixing 3 and 5 volt transistors in one device. A thin gate oxide of about 90 Angstroms is grown in the conventional 3 V, 0.6 micron process while a thick gate oxide of about 140 Angstroms is grown in the conventional 5 V, 0.6 micron process. The thick gate oxide under a 3 V transistor will cause poor device performance and speed while a thin gate oxide under a 5 V transistor will cause a reliability problem in the gate oxide film.

U.S. Pat. No. 4,716,126 to Cogan shows the use of nitrogen implantation into silicon surfaces and annealing wherein the nitrogen is an oxidation retardant. U.S. Pat. No. 4,948,742 to Nishimura et al shows ion implantation of nitrogen and oxygen into the depth of a silicon body to form dielectric regions within the silicon body.

SUMMARY OF THE INVENTION

A principal object of the present invention is to provide an effective and very manufacturable method of simultaneously forming both 3 and 5 V transistors in the fabrication of an integrated circuit.

Another object of the present invention is to provide an effective and very manufacturable method of simultaneously forming differential gate oxide for both 3 and 5 V transistors in the fabrication of an integrated circuit.

In accordance with the objects of this invention a new method of simultaneously forming differential gate oxide for both 3 and 5 V transistors is achieved. A sacrificial silicon oxide layer is formed on the surface of a semiconductor substrate. Ions are implanted through the sacrificial silicon oxide layer into the planned 3 V transistor area of the semiconductor substrate wherein the implanted ions depress the oxidation rate of the semiconductor substrate. Alternatively, ions are implanted through the sacrificial silicon oxide layer into the planned 5 V transistor area of the semiconductor substrate wherein the implanted ions increase the oxidation rate of the semiconductor substrate. The sacrificial silicon oxide layer is removed and a layer of gate silicon oxide is grown on the surface of the semiconductor substrate. The growth rate of the gate silicon oxide will be slowed in the planned 3 V transistor area or will be increased in the planned 5 V transistor area resulting in a gate silicon oxide layer which is relatively thinner in the planned 3 V transistor area and relatively thicker in the planned 5 V transistor area. A layer of polysilicon is deposited over the gate silicon oxide layer and patterned to form gate electrodes for the 3 V and 5 V transistors.

In an alternative process, a gate silicon oxide layer is formed on the surface of a semiconductor substrate. A polysilicon layer is deposited overlying the gate silicon oxide layer. Ions are implanted into the polysilicon layer in the planned 5 V transistor area of the semiconductor substrate and the substrate is annealed. The ions displace oxygen within the gate silicon oxide layer. The displaced oxygen oxidizes the polysilicon layer resulting in an increased thickness gate silicon oxide layer in the planned 5 V transistor area resulting in a gate silicon oxide layer that is relatively thicker in the planned 5 V transistor area and relatively thinner in the planned 3 V transistor area. The polysilicon layer is patterned to form gate electrodes for the 3 V and 5 V transistors.

BRIEF DESCRIPTION OF THE DRAWINGS

In the accompanying drawings forming a material part of this description, there is shown.

DESCRIPTION OF THE PREFERRED EMBODIMENTS

Figure 1:
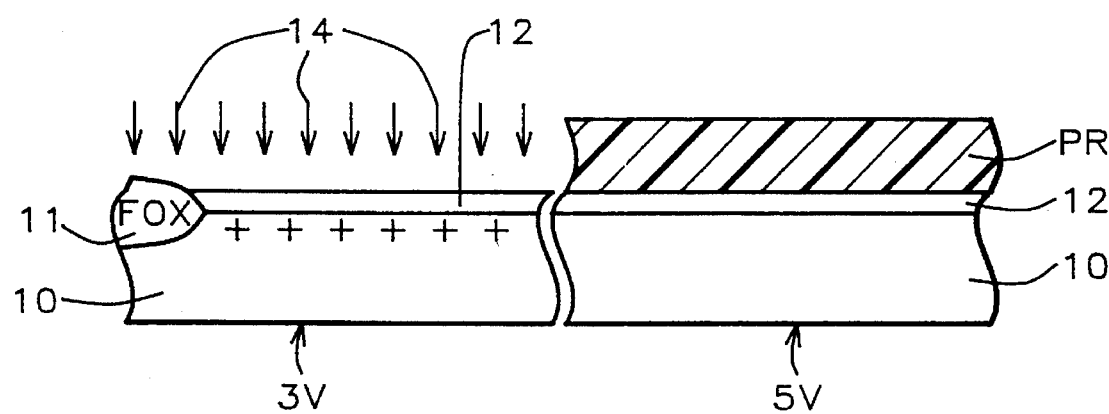
FIGS. 1 and 2 schematically illustrate in cross-sectional representation one preferred embodiment of the present invention.
Figure 2:
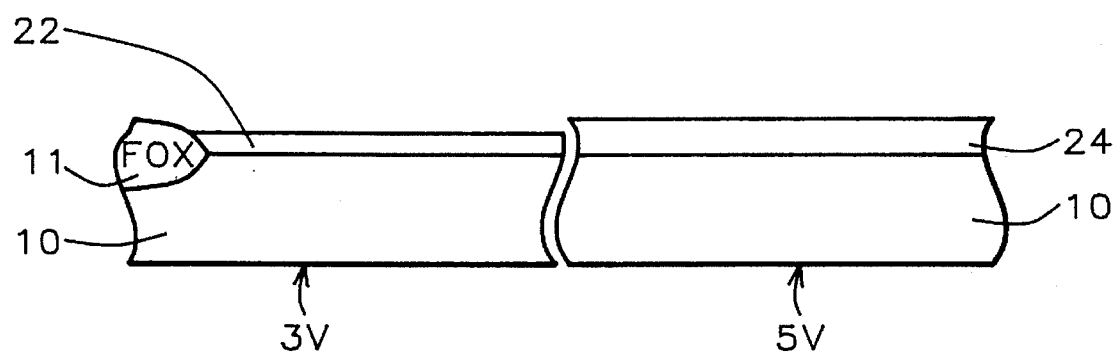

The first preferred embodiment of the present invention will be described with reference to FIGS. 1 and 2. Referring now more particularly to FIG. 1, there is illustrated a portion of a partially completed integrated circuit. There is shown a semiconductor substrate 10, preferably composed of monocrystalline silicon. Field OXide regions 11 are formed as is conventional in the art. A layer of sacrificial silicon oxide 12 is grown on the surface of the semiconductor substrate to a thickness of between about 200 to 400 Angstroms. A layer of photoresist is coated over the planned 5 V portion of the semiconductor substrate.

Nitrogen ions 14 are implanted through the sacrificial silicon oxide layer 12 into the semiconductor substrate 10 in the planned 3 V transistor region not covered by the photoresist. The ions are implanted at a dosage of between about 1 E 14 to 3 E 14 atoms/cm$^2$ and energy of between about 30 to 50 KeV. The nitrogen ions within the semiconductor substrate will depress the oxidation rate of the substrate.

Figure 3:
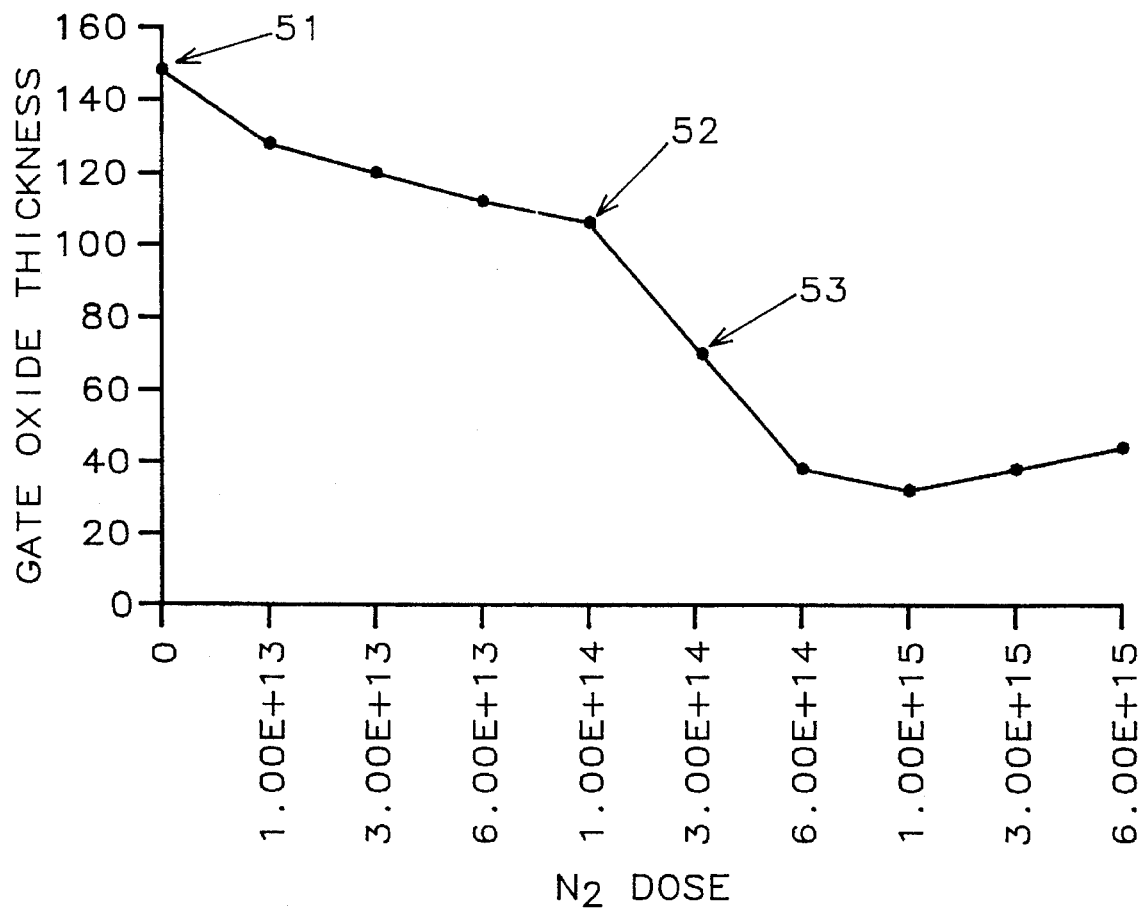
FIG. 3 graphically illustrates the effect of nitrogen ion implantation on gate oxide thickness.

Referring now to FIG. 3, there is shown a graph relating gate oxide thickness to nitrogen ion dosage. It can be seen that a gate oxide thickness of about 150 Angstroms (51) with no implant would be reduced to a thickness of about 110 Angstroms (52) with a nitrogen ion implant dosage of about 1 E 14 atoms/cm$^2$ and would be reduced to a thickness of about 70 Angstroms (53) with a nitrogen ion implant dosage of about 3 E 14 atoms/cm$^2$.

The sacrificial silicon oxide layer 12 is removed and a gate oxide layer is grown on the surface of the semiconductor substrate. As seen in FIG. 2, the oxidation rate of the implanted portion of the substrate is depressed resulting in a thinner gate oxide layer 22 in the planned 3 V transistor area and a thicker gate oxide layer 24 in the planned 5 V transistor area. Thinner gate oxide layer 22 has a thickness of between about 70 to 100 Angstroms. Thicker gate oxide layer 24 has a thickness of 140 Angstroms.

Figure 4:
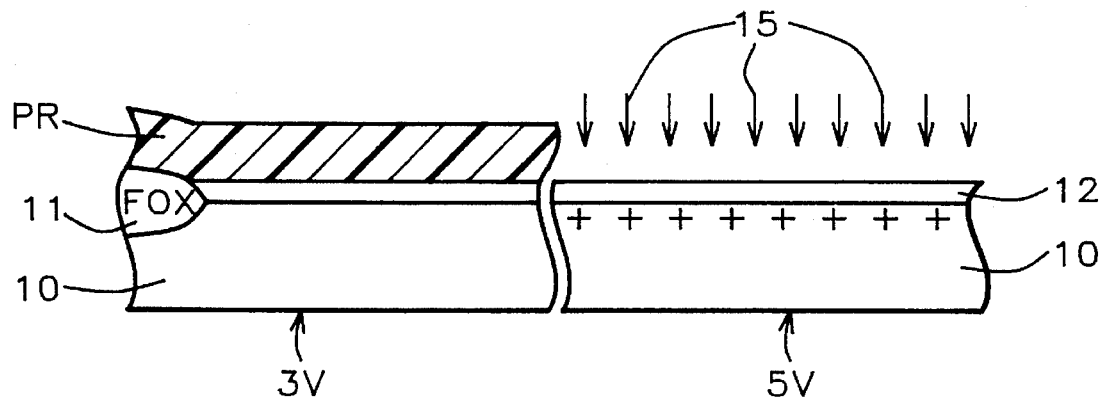
FIGS. 4 and 5 schematically illustrate in cross-sectional representation a second preferred embodiment of the present invention.
Figure 5:
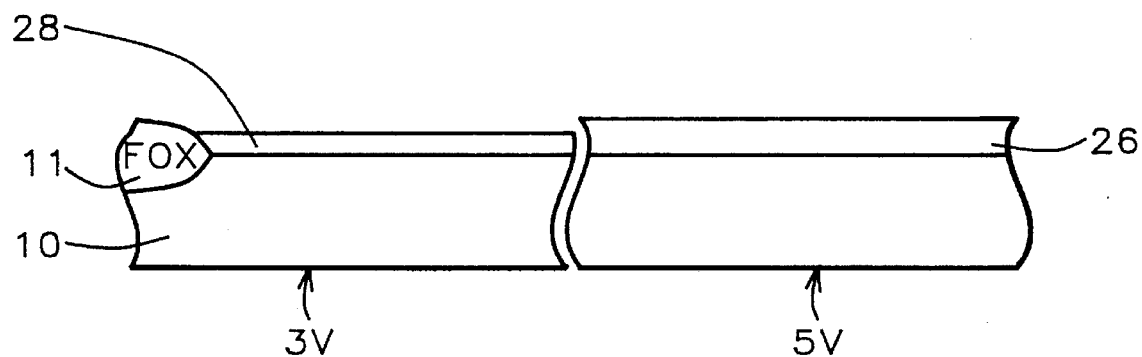

Referring now to FIGS. 4 and 5, the second preferred embodiment of the present invention will be described. Referring to FIG. 4, there is shown a semiconductor substrate 10, preferably composed of monocrystalline silicon. Field OXide regions 11 are formed as is conventional in the art. A layer of sacrificial silicon oxide 12 is grown on the surface of the semiconductor substrate to a thickness of between about 200 to 400 Angstroms. A layer of photoresist is coated over the planned 3 V portion of the semiconductor substrate.

Fluoride ions 15 are implanted through the sacrificial silicon oxide layer 12 into the semiconductor substrate 10 in the planned 5 V transistor region not covered by the photoresist. The ions are implanted at a dosage of between about 7.5 E 15 to 3 E 16 atoms/cm$^2$ and energy of between about 25 to 45 KeV. The fluoride ions within the semiconductor substrate will increase the oxidation rate of the substrate so that the resulting silicon oxide layer is between about 10 to 20 Angstroms thicker in the implanted region than in the non-implanted region.

The sacrificial silicon oxide layer 12 is removed and a gate oxide layer is grown on the surface of the semiconductor substrate. As seen in FIG. 5, the oxidation rate of the implanted portion of the substrate is increased resulting in a thicker gate oxide layer 26 in the planned 5 V transistor area and a thinner gate oxide layer 28 in the planned 3 V transistor area. Thinner gate oxide layer 28 has a thickness of about 100 Angstroms. Thicker gate oxide layer 26 has a thickness of between about 110 to 120 Angstroms.

Figure 6:
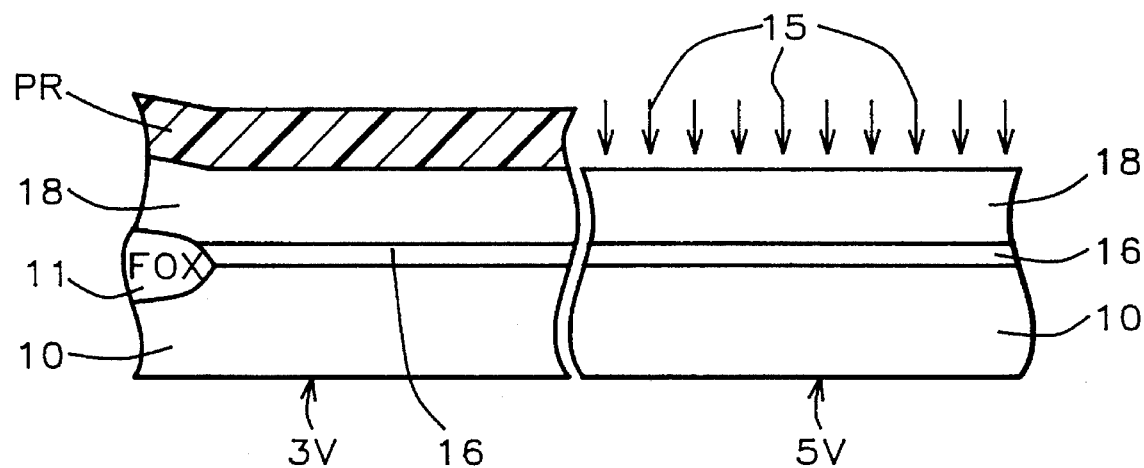
FIGS. 6 and 7 schematically illustrate in cross-sectional representation a third preferred embodiment of the present invention.
Figure 7:
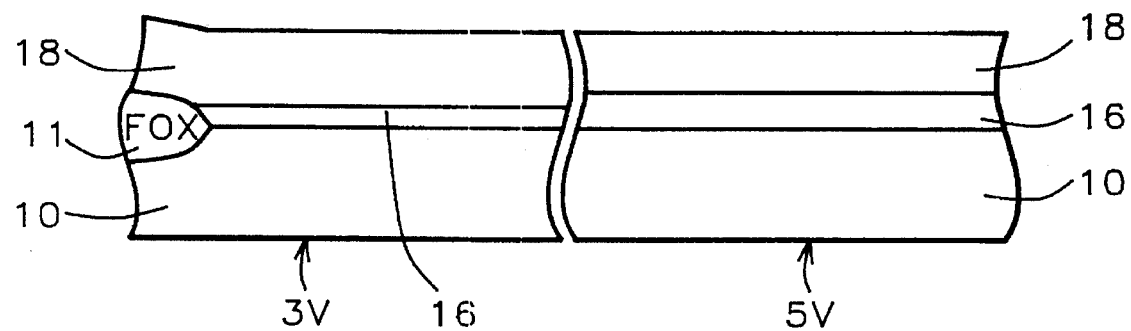

Referring now to FIGS. 6 and 7, the third preferred embodiment of the present invention will be described. Referring to FIG. 6, there is shown a semiconductor substrate 10, preferably composed of monocrystalline silicon. Field OXide regions 11 are formed as is conventional in the art. A layer of gate oxide 16 is grown on the surface of the semiconductor substrate to a thickness of about 100 Angstroms. A layer of polysilicon 18 is deposited over the gate silicon oxide layer to a thickness of between about 1000 to 2000 Angstroms. A layer of photoresist is coated over the planned 3 V portion of the semiconductor substrate.

Fluoride ions 15 are implanted into the polysilicon layer in the planned 5 V transistor region not covered by photoresist. The ions are implanted at a dosage of between about 7.5 E 15 to 3 E 16 atoms/cm$^2$ and energy of between about 70 to 110 KeV. The substrate is annealed at a temperature of between about 900° to 950° C. for a duration of between about 30 to 60 minutes. After annealing, the portion of the gate oxide layer 20 in the planned 5 V transistor region has increased by between about 10 to 20 Angstroms. Fluorine is a strong reducing agent that can break the Si—O bonds and displace oxygen at these sites. The released oxygen then diffuses to the interfaces between the silicon, silicon oxide, and polysilicon and oxidizes the silicon and polysilicon resulting in the additional oxide thickness.

Figure 8:
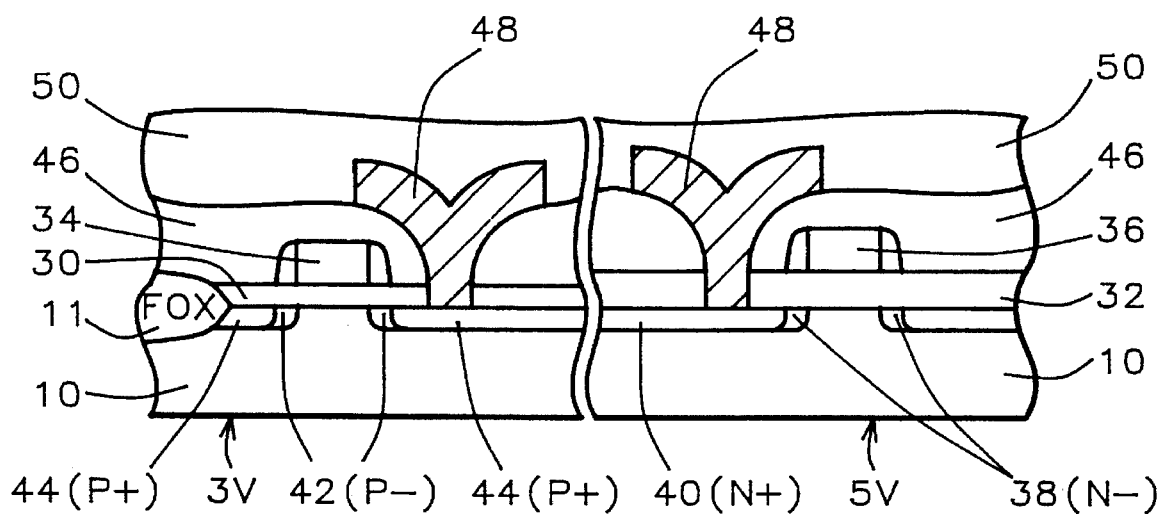
FIG. 8 schematically illustrates in cross-sectional representation a completed integrated circuit of the present invention.

As seen in FIG. 7, the gate oxide layer 20 is thicker in the planned 5 V transistor area than the deposited gate oxide layer 16 in the planned 3 V transistor area. The thickness of the layers 18 and 20 have been exaggerated in the figures in order to more clearly illustrate the process of the invention. The consumed polysilicon thickness is no more than about 10 Angstroms which is indistinguishable in relation to the 1000 to 2000 Angstrom polysilicon thickness. FIG. 8 illustrates a completed integrated circuit, according to the process of the present invention, with both 3 and 5 volt transistors. Thinner gate oxide layer 30 has been formed in the 3 V area and thicker gate oxide layer 32 has been formed in the 5 V area according to any of the three preferred embodiments of the present invention. 3 V transistor 34 and 5 V transistor 36 are shown. It is well understood by those skilled in the art that NMOS and PMOS devices can be fabricated in either the 3 V or the 5 V areas. Typically, internal circuits will be operated at 3 volts while input/output circuits will need 5 volt operation.

For example, the integrated circuit of the present invention may be completed as shown in FIG. 8 by forming lightly doped drain regions 38 and 42 and source and drain regions 40 and 42. A dielectric layer composed of, for example, borophosphosilicate glass (BPSG) and or silicon dioxide 46 covers the semiconductor device structures. Openings are made through the dielectric layer 46 to the source and drain regions 40 and 44 within the semiconductor substrate where contacts are desired. A metal layer 48, typically aluminum, is deposited to fill the contact openings and patterned. A passivation layer 50 completes fabrication of the integrated circuit.

While the invention has been particularly shown and described with reference to the preferred embodiments thereof, it will be understood by those skilled in the art that various changes in form and details may be made without departing from the spirit and scope of the invention.

What is claimed is:

1. The method of simultaneously forming both a 3 and a 5 V transistor in the manufacture of an integrated circuit comprising:

forming a sacrificial silicon oxide layer on the surface of a semiconductor substrate;

implanting ions through said sacrificial silicon oxide layer into an area of said semiconductor substrate where said 3 V transistor is to be formed wherein said ions depress the oxidation rate of said semiconductor substrate and wherein annealing is not required;

removing said sacrificial silicon oxide layer;

growing a layer of gate silicon oxide on the surface of said semiconductor substrate wherein the growth rate of said gate silicon oxide will be slower in said 3 V transistor area and wherein said gate silicon oxide layer will be thinner in said 3 V transistor area than the gate oxide layer in said 5 V transistor area;

depositing a layer of polysilicon over said gate silicon oxide layer and patterning said polysilicon layer to form gate electrodes for said 3 V and said 5 V transistors;

forming source and drain regions within said semiconductor substrate adjoining said 3 V and said 5 V transistors;

depositing a dielectric layer overlying the top surface of said semiconductor substrate and said 3 V and said 5 V transistors;

forming openings within said dielectric layer to said underlying source and drain regions where electrical connections are to be made to said 3 V and said 5 V transistors; and filling said openings with a patterned metal layer to complete said electrical connections in the fabrication of said integrated circuit.

2. The method of claim 1 wherein said sacrificial oxide has a thickness of between about 200 to 400 Angstroms.

3. The method of claim 1 wherein said ions are nitrogen ions implanted into said semiconductor substrate with a dose of between about 1 E 14 to 3 E 14 atoms/cm$^2$ and energy of between about 30 to 50 KeV.

4. The method of claim 1 wherein said gate silicon oxide layer in said 3 V transistor area has a thickness of between about 70 to 100 Angstroms and wherein said gate silicon oxide layer in said 5 V transistor area has a thickness of about 140 Angstroms.

5. The method of simultaneously forming both a 3 and a 5 V transistor in the manufacture of an integrated circuit comprising:

forming a sacrificial silicon oxide layer on the surface of a semiconductor substrate;

implanting fluorine ions through said sacrificial silicon oxide layer into an area of said semiconductor substrate where said 5 V transistor is to be formed wherein said fluorine ions increase the oxidation rate of said semiconductor substrate;

removing said sacrificial silicon oxide layer;

growing a layer of gate silicon oxide on the surface of said semiconductor substrate wherein the growth rate of said gate silicon oxide will be faster in said 5 V transistor area and wherein said gate silicon oxide layer will be thicker in said 5 V transistor area than the gate silicon oxide layer in the 3 V transistor area;

depositing a layer of polysilicon over said gate silicon oxide layer and patterning said polysilicon layer to form gate electrodes for said 3 V and said 5 V transistors;

forming source and drain regions within said semiconductor substrate adjoining said 3 V and said 5 V transistors;

depositing a dielectric layer overlying the top surface of said semiconductor substrate and said 3 V and said 5 V transistorst;

forming openings within said dielectric layer to said underlying source and drain regions where electrical connections are to be made to said 3 V and said 5 V transistors; and filling said openings with a patterned metal layer to complete said electrical connections in the fabrication of said integrated circuit.

6. The method of claim 5 wherein said sacrificial oxide has a thickness of between about 200 to 400 Angstroms.

7. The method of claim 5 wherein said fluorine ions are implanted into said semiconductor substrate with a dose of between about 7.5 E 15 to 3 E 16 atoms/cm$^2$ and energy of between about 25 to 45 KeV.

8. The method of claim 5 wherein said gate silicon oxide layer in said 5 V transistor area has a thickness of between about 110 to 120 Angstroms and wherein said gate silicon oxide layer in said 3 V transistor area has a thickness of about 100 Angstroms.

9. The method of simultaneously forming both a 3 V and a 5 V transistor in the manufacture of an integrated circuit comprising:

forming a gate silicon oxide layer on the surface of a semiconductor substrate;

depositing a polysilicon layer overlying the gate silicon oxide layer;

implanting ions into said polysilicon layer in the 5 V transistor area of said semiconductor substrate;

annealing said substrate wherein said ions displace oxygen within said gate silicon oxide layer and wherein said displaced oxygen oxidizes said polysilicon layer resulting in an increased thickness gate silicon oxide layer in said 5 V transistor area wherein said gate silicon oxide layer will be thicker in said 5 V transistor area than the gate silicon oxide in said 3 V transistor area;

patterning said polysilicon layer to form gate electrodes for said 3 V and said 5 V transistors;

forming source and drain regions within said semiconductor substrate adjoining said 3 V and said 5 V transistors;

depositing a dielectric layer overlying the top surface of said semiconductor substrate and said 3 V said 5 V transistors;

forming openings within said dielectric layer to said underlying source and drain regions where electrical connections are to be made to said 3 V and said 5 V transistors; and filling said openings with a patterned metal layer to complete said electrical connections in the fabrication of said integrated circuit.

10. The method of claim 9 wherein said gate silicon oxide layer has a thickness of about 100 Angstroms.

11. The method of claim 9 wherein said ions are fluorine ions implanted into said polysilicon layer with a dose of between about 7.5 E 15 to 3 E 16 atoms/cm$^2$ and energy of between about 70 to 110 KeV.

12. The method of claim 9 wherein said substrate is annealed at a temperature of between about 900° to 950° C. for a duration of between about 30 to 60 minutes.

13. The method of claim 9 wherein said gate silicon oxide layer in said 5 V transistor area has a thickness of between about 110 to 120 Angstroms and wherein said gate silicon oxide layer in said 3 V transistor area has a thickness of about 100 Angstroms.

14. The method of simultaneously forming both a 3 V and a 5 V transistor in the manufacture of an integrated circuit comprising:

forming a gate silicon oxide layer having a thickness of about 100 Angstroms on the surface of a semiconductor substrate;

depositing a polysilicon layer overlying the gate silicon oxide layer;

implanting ions into said polysilicon layer in the 5 V transistor area of said semiconductor substrate;

annealing said substrate wherein said ions displace oxygen within said gate silicon oxide layer and wherein said displaced oxygen oxidizes said polysilicon layer resulting in an increased thickness gate silicon oxide layer in said 5 V transistor area wherein said gate silicon oxide layer will be between about 110 to 120 Angstroms thick in said 5 V transistor area and will be about 100 Angstroms thick in said 3 V transistor area;

patterning said polysilicon layer to form gate electrodes for said 3 V and said 5 V transistors;

forming source and drain regions within said semiconductor substrate adjoining said 3 V and said 5 V transistors;

depositing a dielectric layer overlying the top surface of said semiconductor substrate and said 3 V and said 5 V transistors;

forming openings within said dielectric layer to said underlying source and drain regions where electrical connections are to be made to said 3 V and said 5 V transistors; and filling said openings with a patterned metal layer to complete said electrical connections in the fabrication of said integrated circuit.

15. The method of claim 14 wherein said ions are fluorine ions implanted into said polysilicon layer with a dose of between about 7.5 E 15 to 3 R 16 atoms/cm$^2$ and energy of between about 70 to 110 KeV.

16. The method of claim 14 wherein said substrate is annealed at a temperature of between about 900° to 950° C.
for a duration of between about 30 to 60 minutes.

* * * * *